United States Patent
ALNuaimi et al.

(10) Patent No.: US 12,538,800 B1
(45) Date of Patent: Jan. 27, 2026

(54) MICROCHANNEL HEAT SINK WITH TPMS FINNED STRUCTURES FOR ENHANCED THERMAL EFFICIENCY

(71) Applicant: United Arab Emirates University, Al Ain (AE)

(72) Inventors: Saeed Khalfan Ali ALNuaimi, Sharjah (AE); Ahmed Raafat Abdelfattah Mostafa, Sharjah (AE); Mohamed Moustafa Zaki Ahmed Kamra, Sharjah (AE)

(73) Assignee: UNITED ARAB EMIRATES UNIVERSITY, Al Ain (AE)

(*) Notice: Subject to any disclaimer, the term of this patent is extended or adjusted under 35 U.S.C. 154(b) by 0 days.

(21) Appl. No.: 19/022,335

(22) Filed: Jan. 15, 2025

(51) Int. Cl.
*H01L 23/473* (2006.01)

(52) U.S. Cl.
CPC .................. *H01L 23/473* (2013.01)

(58) Field of Classification Search
CPC .................................................... H01L 23/473

USPC ........................................................ 257/712
See application file for complete search history.

(56) References Cited

U.S. PATENT DOCUMENTS

2022/0196337 A1* 6/2022 Torresin .............. H01L 21/4871

FOREIGN PATENT DOCUMENTS

EP            3723464 A1 * 10/2020  ........... F28D 1/0366

* cited by examiner

*Primary Examiner* — Ajay Arora
(74) *Attorney, Agent, or Firm* — Hayes Soloway P.C.

(57) ABSTRACT

The present disclosure in general relates to the field of heat sinks (e.g. microchannel heat sinks). The present disclosure is further directed towards a microchannel heat sink for applications in microchips. The microchannel heat sink comprises a base and a plurality of microchannel units extending from the base. The plurality of microchannel units are arranged in parallel and at regular intervals on the base. Each microchannel unit comprises two or more pin-fins. Each pin-fin comprises a triply periodic minimal surface (TPMS) lattice structure. The present disclosure also relates to pin-fins comprising triply periodic minimal surface (TPMS) lattice structure.

18 Claims, 6 Drawing Sheets

MICROCHANNEL HEAT SINK WITH TPMS FINNED STRUCTURES FOR ENHANCED THERMAL EFFICIENCY

TECHNICAL FIELD

The present disclosure in general relates to the field of heat sinks (e.g. microchannel heat sinks) for cooling applications. The present disclosure is further directed towards a microchannel heat sink for applications in microchips. The present disclosure also relates to pin-fins comprising a triply periodic minimal surface (TPMS) lattice structure.

BACKGROUND

The information in this section merely provides background information that will be useful in understanding the present disclosure and may not constitute prior art(s) for the present disclosure.

Heatsinks provide thermal management in several applications (e.g. for power electronic devices). Their primary function is to dissipate heat and reduce the maximum operating temperature of heat-generating components, ensuring reliable performance and preventing overheating. In the context of compact electronic devices, such as integrated circuits, microchannel heatsinks have proven especially effective. These advanced heatsinks are well-suited for coupling with smaller devices, offering efficient heat dissipation within limited spaces.

Microchannel heat sinks play a critical role in thermal management across a variety of high-performance applications, for example, for high-performance microchips where there is a constant demand for superior cooling performance and reduced power consumption. The increasing demand for high cooling performance and low power consumption in microchips has driven significant research toward optimizing microchannel heat sink designs to meet escalating thermal performance requirements while minimizing energy consumption.

To enhance cooling performance, previous studies have explored integrating pin fins with conventional shapes, such as square or cylindrical pin fins, into microchannel heat sinks. These fins are designed to increase the surface area available for heat transfer, thereby improving thermal dissipation. However, such traditional microchannel heat sink designs often introduce significant drawbacks.

The increased surface area, while beneficial for heat rejection, results in higher pressure drops due to the increased flow resistance within the microchannels. This trade-off between thermal performance and pressure drop creates inefficiencies, limiting the overall effectiveness of the cooling system.

For example, these conventional pin fins frequently result in increased pressure drops due to higher flow resistance, which negatively impacts the overall efficiency of the cooling system. Although enhanced heat transfer may be achieved, this is usually at a cost of elevated pressure drops, which require higher pumping power and can compromise system efficiency.

Conventional pins sacrifice pressure drop for high heat rejection, while streamlined pins, such as elliptical and circular pin fins, achieve lower pressure drop but at the cost of reduced cooling performance.

Various pin fin geometries have been explored in the art to mitigate such issues. There remains a persistent challenge in microchannel heat sink design to achieve an optimal balance between thermal performance and hydraulic efficiency.

The present disclosure is directed to overcome one or more limitations stated above or any other limitations associated with the known arts.

SUMMARY

One or more shortcomings of the prior art are overcome by the present invention as claimed and additional advantages are provided through the present disclosure. Additional features and advantages are realized through the techniques of the present disclosure. Other embodiments, implementations and aspects of the disclosure are described in detail herein and are considered a part of the claimed disclosure.

According to a first aspect of the disclosure, provided herein is a heat sink (e.g. a microchannel heat sink). The microchannel heat sink comprises a base and a plurality of microchannel units extending from the base. The plurality of microchannel units are arranged in parallel and at regular intervals on the base. Each microchannel unit comprises two or more pin-fins. Each pin-fin comprises a triply periodic minimal surface (TPMS) lattice structure.

According to an embodiment of the present disclosure, each microchannel unit has a length of about 13500 to 16500 micrometres.

According to an embodiment of the present disclosure, each microchannel unit has a width of about 270 to 330 micrometres.

According to an embodiment of the present disclosure, each microchannel unit has a height of about 450 to 550 micrometres.

According to an embodiment of the present disclosure, each microchannel unit has a hydraulic diameter of about 90 to 165 micrometres.

According to an embodiment of the present disclosure, the two or more pin-fins are arranged to be spaced at regular intervals.

According to an embodiment of the present disclosure, the distance between each pin-fin is about 2250 to 2750 micrometres.

According to an embodiment of the present disclosure, each pin-fin has a length of about 67 to 83 micrometres.

According to an embodiment of the present disclosure, each pin-fin has a height of about 90 to 165 micrometres. For example, each pin-fin has a height of about 90 to 135 micrometres.

According to an embodiment of the present disclosure, each microchannel unit comprises five pin-fins.

According to an embodiment of the present disclosure, each pin-fin comprises a triply periodic minimal surface (TPMS) lattice structure selected from the group consisting of Gyroid, Diamond, and Iwp. For example, each pin-fin comprises a TPMS-Iwp lattice structure.

According to an embodiment of the present disclosure, each pin-fin is formed of a hybrid square-TPMS lattice structure. For example, the hybrid square-TPMS lattice structure is formed of one to two periodic unit cells.

According to an embodiment of the present disclosure, the microchannel heat sink further comprises a cover plate configured to cover the plurality of microchannel units. For example, the cover plate is glass.

According to a second aspect of the disclosure, provided herein is a microchip comprising a microchannel heat sink according to a first aspect of the disclosure.

BRIEF DESCRIPTION OF THE DRAWINGS

In order to better understand the subject matter that is disclosed herein and to exemplify how it may be carried out in practice, embodiments will now be described, by way of non-limiting examples only, with reference to the accompanying drawings, in which:

FIG. 4 depicts a comparative analysis of the performance of microchannel heat sinks, evaluating the pressure drop of water between the inlet and outlet as it flows through.

The foregoing and other objects, features and advantages of the present invention, as well as the invention itself, will be more fully understood from the following description of preferred embodiments, when read together with the accompanying drawings.

DETAILED DESCRIPTION

In the following detailed description of illustrative or exemplary embodiments of the disclosure, specific embodiments in which the disclosure may be practiced are described in sufficient detail to enable those skilled in the art to practice the disclosed embodiments. The following detailed description is, therefore, not to be taken in a limiting sense, and the scope of the present disclosure is defined by the appended claims and equivalents thereof. References within the specification to "one embodiment," "an embodiment," "embodiments," or "one or more embodiments" are intended to indicate that a particular feature, structure, or characteristic described in connection with the embodiment is included in at least one embodiment of the present disclosure.

The principles of the present disclosure and their advantages are best understood by referring to FIGS. 1-6.

According to a first aspect of the disclosure, provided herein is a heat sink (e.g. a microchannel heat sink). The microchannel heat sink comprises a base and a plurality of microchannel units extending from the base. The plurality of microchannel units are arranged in parallel and at regular intervals on the base.

The present invention has especially discovered the advantages of the microchannel heat sinks according to the present invention for providing superior cooling performance compared to conventional microchannel heat sinks. The microchannel heat sinks have been found to exhibit effective heat exchanging capacities and other thermal management applications due to their superior performance characteristics, offering an optimal balance between structural strength, hydrothermal performance and thermal performance.

Figure 1:
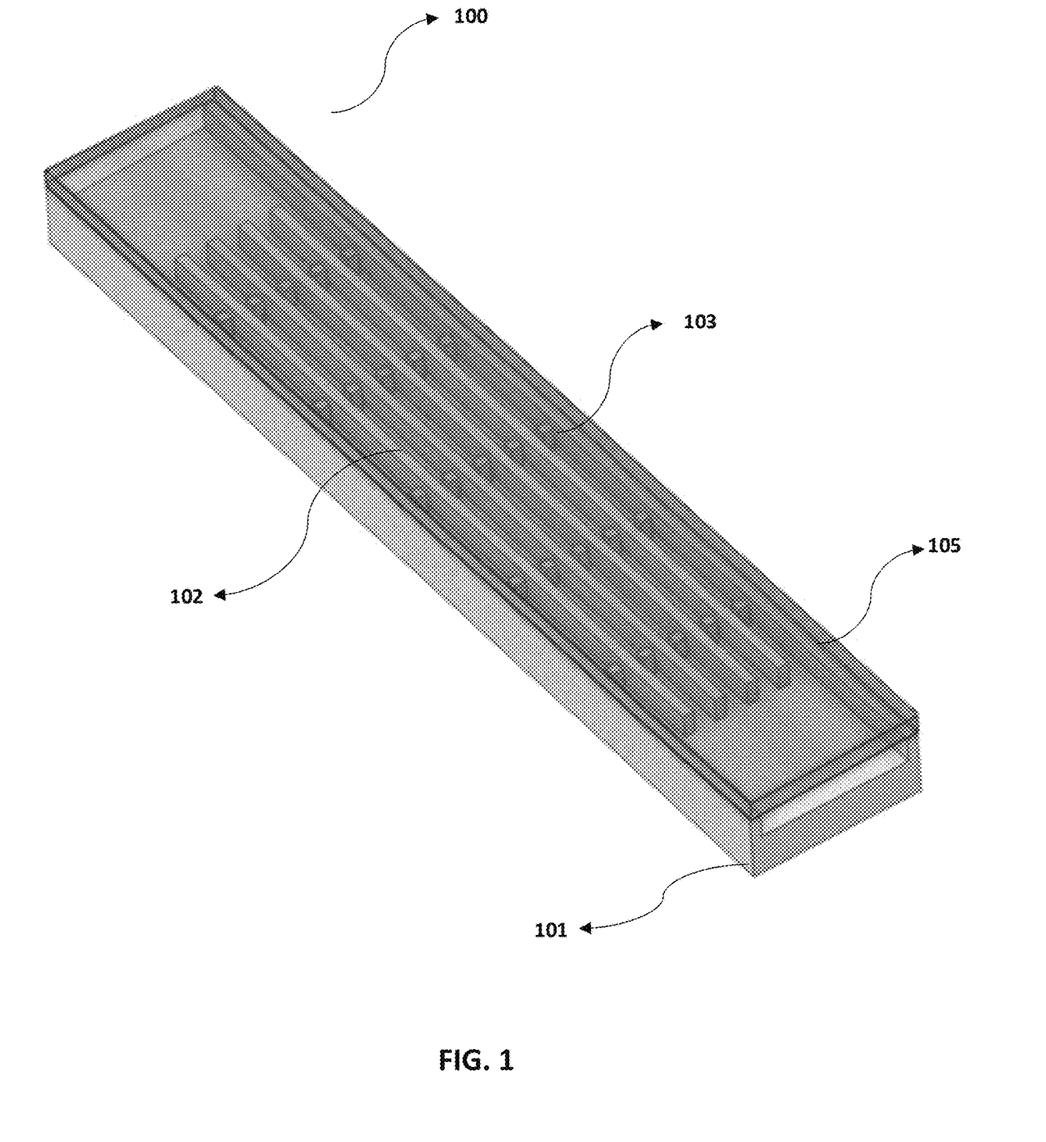
FIG. 1 illustrates the topology of a microchannel heatsink according to an embodiment of the present disclosure.

FIG. 1 illustrates a microchannel heat sink (100) according to a first aspect of the present disclosure. The microchannel heat sink comprises a base (101) and a plurality of microchannel units (102) extending from the base (101). The plurality of microchannel units (102) are arranged in parallel and at regular intervals on the base (101). Each microchannel unit (102) comprises two or more pin-fins (103). Each pin-fin (103) comprises a triply periodic minimal surface (TPMS) lattice structure (104). The microchannel heat sink (100) may further comprise a cover plate (105) configured to cover the plurality of microchannel units (102).

The microchannel units are configured to allow a coolant fluid flow from one side to the other. For example, in a microchip, the base of the microchannel would be in direct contact with the microchip in order to reject heat. In some embodiments, the microchannel heat sink further comprises a liquid inlet. The liquid inlet may be configured such that a coolant fluid is introduced into said microchannel heat sink through said liquid inlet.

In some embodiments, the microchannel heat sink may be made of silicon. According to an aspect of the present invention, there is provided a method of manufacturing a microchannel heat sink, wherein the microchannel heat sink is manufactured using silicon wafer technology and/or nanofabrication techniques. The method provided herein allows for the microchannel heat sink to be manufactured directly onto a microchip. For example, a silicon microchannel heat sink may be fabricated directly onto a silicon microchip. The method provided herein provides a streamlined production, reduced additional processing steps and lowers costs while maintaining high precision and reliability in thermal management.

Figure 2:
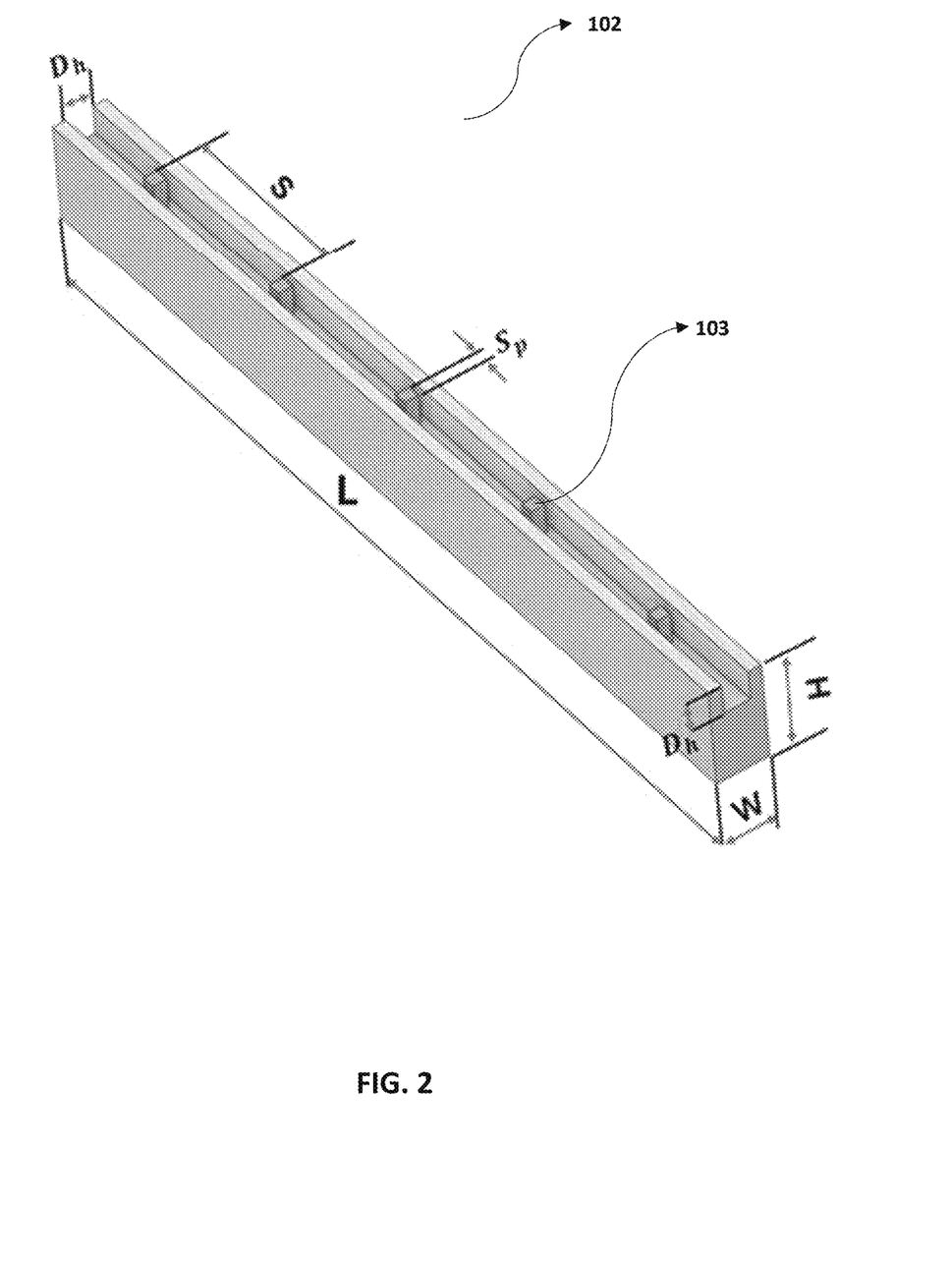
FIG. 2 illustrates the topology of a microchannel unit according to an embodiment of the present disclosure.

FIG. 2 illustrates a microchannel unit according to a first aspect of the present disclosure. Each microchannel unit (102) comprises two or more pin-fins (103). Each pin-fin (103) comprises a triply periodic minimal surface (TPMS) lattice structure (104).

According to an embodiment of the present disclosure, each microchannel unit has a length between about 13500 to 16500 micrometres. The length of each microchannel unit may be defined by the symbol L, as depicted in FIG. 2. The length of each microchannel unit may be between about 13750 to 16250 micrometres, preferably between 14000 to 1600 micrometres, more preferably between 14500 to 15500 micrometres. In a preferred embodiment, each microchannel unit has a length between about 14600 to 15400 micrometres, preferably between 14700 to 15300 micrometres, even more preferably between 14800 to 15200 micrometres. In some embodiments, each microchannel unit has a length of about 1500 micrometres.

According to an embodiment of the present disclosure, each microchannel unit has a width of about 270 to 330 micrometres. The width of each microchannel unit may be defined by the symbol W, as depicted in FIG. 2. The width of each microchannel unit may be between about 280 to 320 micrometres, preferably between 290 to 310 micrometres. In a preferred embodiment, each microchannel unit has a width of about 300 micrometres.

According to an embodiment of the present disclosure, each microchannel unit has a height of about 450 to 550 micrometres. The height of each microchannel unit may be defined by the symbol H, as depicted in FIG. 2. The height of each microchannel unit may be between about 460 to 540 micrometres, preferably between 470 to 530 micrometres, more preferably between 480 to 520 micrometres, even more preferably between 490 to 510 micrometres. In a preferred embodiment, each microchannel unit has a height of about 500 micrometres.

According to an embodiment of the present disclosure, each microchannel unit has a hydraulic diameter of about 90 to 165 micrometres. The hydraulic diameter (e.g. inner hydraulic diameter) of each microchannel unit may be defined by the symbol Dh, as depicted in FIG. 2. The hydraulic diameter defines the diameter of the spacing within each microchannel unit. The hydraulic diameter of each microchannel unit may be between about 135 to 165 micrometres, preferably between 145 to 155 micrometres, more preferably about 150 micrometres. In some embodiments, the hydraulic diameter of each microchannel unit may be between about 105 to 135 micrometres, preferably between 110 to 130 micrometres, more preferably between about 115 to 125 micrometres. For example, the hydraulic diameter of each microchannel unit may be about 120 micrometres. In other embodiments, the hydraulic diameter of each microchannel unit may be between about 90 to 110 micrometres, preferably between 95 to 105 micrometres, more preferably about 100 micrometres. In some embodiments, the hydraulic diameter value of each microchannel unit is the same as the height of each pin-fin.

Table 1 below provides the dimensions of the microchannel unit illustrated in FIG. 2, according to an embodiment of the present disclosure.

TABLE 1

Repeating Microchannel Dimensions.

| Parameter | Symbol | Dimension |
| --- | --- | --- |
| Channel Length | L | 15000 μm |
| Channel Width | W | 300 μm |
| Channel Height | H | 500 μm |
| Inner hydraulic diameter | $D_h$ | 150 μm |
| Pin Spacing | S | 2500 μm |
| Pin Side Length | $S_p$ | 75 μm |
| No. of Pins/channel | — | 5 pins |

According to the present disclosure, the microchannel unit comprises two or more pin-fins. For example, each microchannel unit comprises three or more, or four or more pin-fins. In some embodiments, each microchannel unit comprises three or more pin-fins. For example, each microchannel unit comprises four or more pin-fins. In some embodiments, each microchannel unit comprises between two to eight pin-fins, preferably between three to seven pin-fins, more preferably between four to six pin-fins. According to an embodiment of the present disclosure, each microchannel unit comprises five pin-fins.

According to an embodiment of the present disclosure, the two or more pin-fins are arranged to be spaced at regular intervals. For example, when the microchannel unit comprises three pin-fins, the three pin-fins are spaced at regular intervals within the microchannel unit. When the microchannel unit comprises five pin-fins, the five pin-fins are spaced at regular intervals within the microchannel unit.

According to an embodiment of the present disclosure, the distance between each pin-fin is about 2250 to 2750 micrometres. The distance between each pin-fin may be defined by the symbol S, as depicted in FIG. 2. In some embodiments, each pin-fin is spaced along the microchannel unit at equal distances apart. In other words, the pin-fins are the same distance (S-distance) apart from one another along the microchannel unit. In some embodiments, the distance between each pin-fin is between about 2300 to 2700 micrometres, preferably between about 2350 to 2650 micrometres, more preferably between about 2400 to 2600 micrometres, even more preferably between about 2450 to 2550 micrometres. In a preferred embodiment, the distance between each pin-fin is about 2500 micrometres.

According to an embodiment of the present disclosure, each pin-fin has a length of about 67 to 83 micrometres. The length of each pin-fin may be defined by the symbol Sp, as depicted in FIG. 2. The length of each pin-fin may be the same as the width of each pin-fin. In some embodiments, each pin-fin has a length of between about 68 to 82 micrometres, preferably between about 69 to 81 micrometres, more preferably between about 70 to 80 micrometres. In some embodiments, each pin-fin has a length of between about 71 to 79 micrometres, preferably between about 73 to 77 micrometres. In a preferred embodiment, each pin-fin has a length of about 75 micrometres.

According to an embodiment of the present disclosure, each pin-fin has a height of about 90 to 165 micrometres. For example, each pin-fin has a height of about 90 to 135 micrometres. The height of each pin-fin corresponds to the height of each pin-fin along the same direction as the height of the microchannel unit. The height of each pin-fin may be between about 135 to 165 micrometres, preferably between 145 to 155 micrometres, more preferably about 150 micrometres. In some embodiments, the height of each pin-fin may be between about 105 to 135 micrometres, preferably between 110 to 130 micrometres, more preferably between about 115 to 125 micrometres. For example, the height of each pin-fin may be about 120 micrometres. In other embodiments, the height of each pin-fin may be between about 90 to 110 micrometres, preferably between 95 to 105 micrometres, more preferably about 100 micrometres.

According to the present disclosure, each pin-fin comprises a triply periodic minimal surface (TPMS) lattice structure. The TPMS lattice structure is formed of at least one periodic unit cell. For example, the TPMS lattice structure is formed of at least two, at least three or at least four periodic unit cells. In some embodiments, the pin-fin consists of a TPMS lattice structure, wherein the TPMS extends across the pin-fin. Alternatively, the TPMS lattice structure may be combined with an alternative, conventional pin-fin shape (e.g. a square pin-fin) to form a hybrid pin-fin. As defined herein, a 'hybrid pin-fin' refers to a pin-fin formed of a conventional pin-fin shape (e.g. square) and a TPMS lattice structure.

The triply periodic minimal surface (TPMS) lattice structure may be selected from the group consisting of Gyroid, Diamond, and Iwp. For example, each pin-fin may comprise a TPMS-Iwp lattice structure. In some embodiments, the pin-fin consists of a TPMS-Iwp lattice structure, wherein the TPMS-Iwp lattice structure extends across the pin-fin. In some embodiments, the lattice structure may be formed of a plurality of periodic unit cells. For example, the lattice structure may be formed of at least one periodic unit cell in the length and width directions and at least one periodic unit cells in the height direction. Preferably, the lattice structure is formed of at least one periodic unit cell in the length and width directions and at least two periodic unit cells (preferably at least three) in the height direction. In an embodiment of the present invention, each pin-fin comprises a TPMS lattice structure (e.g. a TPMS-Iwp lattice structure) formed of two periodic unit cells in the length and width directions and four periodic unit cells in the height direction.

FIGS. 3A-3D illustrate the topology of several pin-fins (i.e. a square pin-fin, a TPMS-Iwp pin-fin, a square-TPMS-Iwp pin-fin and another square-TPMS-Iwp pin fin) according to the present disclosure. Isometric and frontal views of the respective pin-fins are illustrated herein.

Figures 3A, 3B, 3C, 3D:
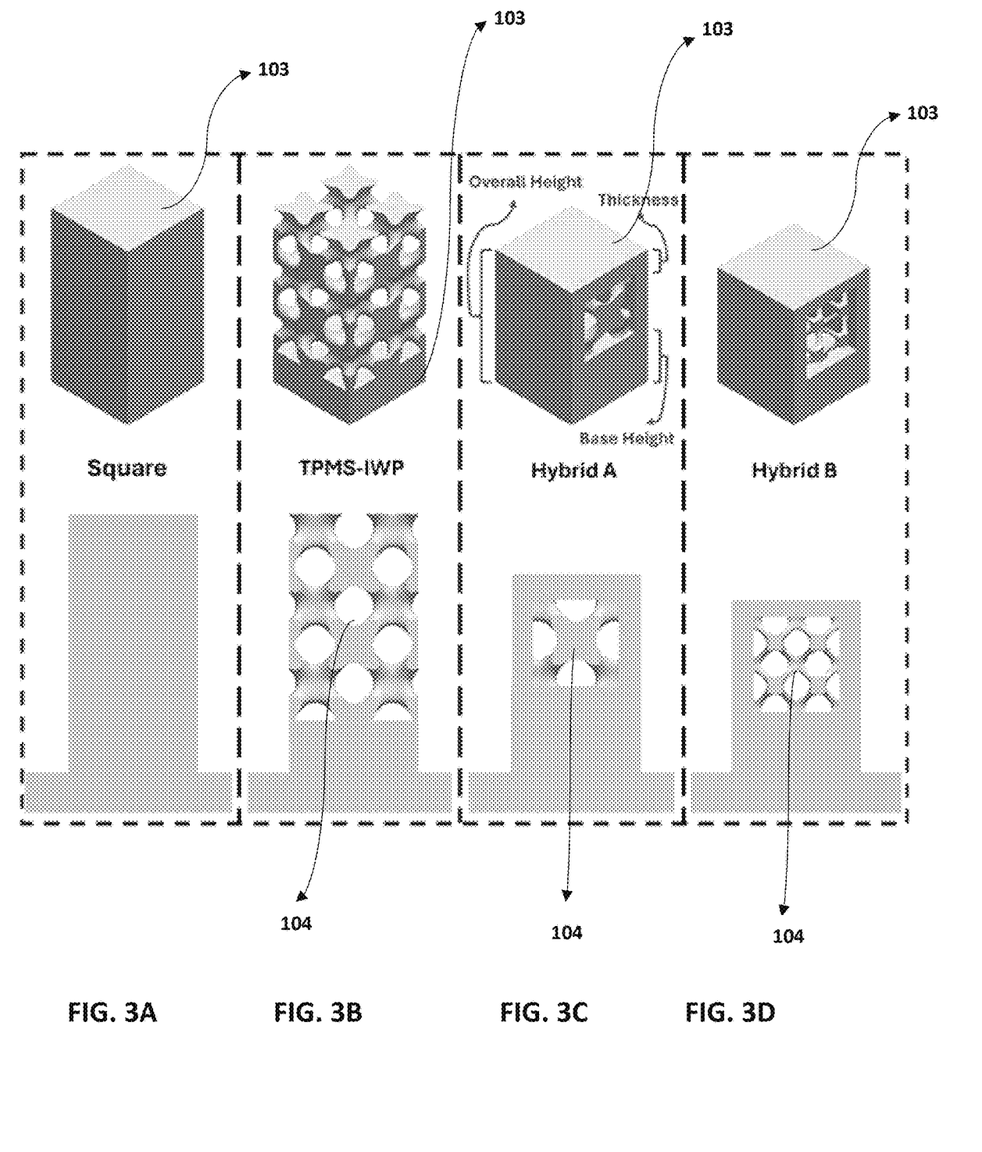
FIGS. 3A-3D illustrate the topology of several pin-fins (i.e. a square pin-fin, a TPMS-Iwp pin-fin, a square-TPMS-Iwp pin fin and another square-TPMS-Iwp pin fin) according to the present disclosure.

FIG. 3A illustrates "Square": a conventional square pin-fin. The pin-fin has the overall dimensions of 75 μm×75

μm×150 μm. That is, a length and width of 75 micrometers and a height of 105 micrometers.

FIG. 3B illustrates "TPMS-IWP": a pin-fin comprising a TPMS-Iwp lattice structure, according to the present disclosure. The pin-fin has the overall dimensions of 75 μm×75 μm×150 μm. That is, a length and width of 75 micrometers and a height of 105 micrometers. The pin-fin comprises a TPMS-Iwp lattice structure formed of two periodic unit cells in the length and width directions and four periodic unit cells in the height direction.

FIG. 3C illustrates "Hybrid A": a hybrid pin-fin comprising a square and TPMS-Iwp lattice structure, according to the present disclosure, referred to herein as a square-TPMS-Iwp pin-fin. The pin-fin comprises a square pin-fin shape comprising a TPMS-Iwp lattice structure. As depicted in FIG. 3(c), the square-TPMS-Iwp pin-fin has an overall height of 120 μm, a base height of 50 μm, and 15 μm of thickness at the top. The TPMS-Iwp lattice structure of the square-TPMS-Iwp pin-fin is formed of one periodic unit cell.

FIG. 3D illustrates "Hybrid B": a hybrid pin-fin comprising a square and TPMS-Iwp lattice structure, according to the present disclosure, referred to herein as a square-TPMS-Iwp pin-fin. The pin-fin comprises a square pin-fin shape comprising a TPMS-Iwp lattice structure. As depicted in FIG. 3D, the square-TPMS-Iwp pin-fin has an overall height of 100 μm, a base height of 35 μm, and 10 μm thickness at the top. The TPMS-Iwp lattice structure of the square-TPMS-Iwp pin-fin is formed of two periodic unit cell.

A hybrid pin-fin according to the present disclosure comprises a conventional pin-fin shape comprising a TPMS lattice structure. For example, a pin-fin comprising a square pin-fin shape and a TPMS lattice structure is referred to herein as a square-TPMS pin fin.

In some embodiments, each pin fin is a hybrid pin-fin. For example, the hybrid pin-fin may be a hybrid pin-fin comprising a TPMS-Iwp lattice structure. In preferred embodiments, the hybrid pin-fin is a square-TPMS-Iwp pin-fin.

The hybrid pin-fin may comprise the TPMS lattice structure in the core of the pin-fin. The hybrid pin-fin may have an overall height of between about 105 to 135 micrometers, preferably between about 110 to 125 micrometers, more preferably between about 115 to 125 micrometers. In a preferred embodiment, the hybrid pin-fin has an overall height of about 120 micrometers. The hybrid pin-fin may have a base height of between about 40 to 60 micrometers (preferably about 50 micrometers) and a thickness at the top of the pin-fin of about 5 to 20 micrometers (preferably about 15 micrometers). The hybrid pin-fin is formed of at least one, at least two, at least three or at least four periodic unit cells. In a preferred embodiment, the hybrid pin-fin is formed of one periodic unit cell.

In some embodiments, the hybrid pin-fin may have overall height of between about 90 to 135 micrometers, preferably between about 95 to 130 micrometers. In some embodiments, the hybrid pin-fin has an overall height of between about 90 to 110 micrometers, preferably between about 95 to 105 micrometers, more preferably about 100 micrometers. The hybrid pin-fin may have a base height of between about 25 to 45 micrometers (preferably about 35 micrometers) and a thickness at the top of the pin-fin of about 5 to 15 micrometers (preferably about 10 micrometers). The hybrid pin-fin is formed of at least one, at least two, at least three or at least four periodic unit cells. In a preferred embodiment, the hybrid pin-fin is formed of two periodic unit cells.

According to an embodiment of the present disclosure, the microchannel heat sink further comprises a cover plate configured to cover the plurality of microchannel units. The cover plate may be a top cover plate arranged to prevent leakage (e.g. leakage of liquid flowing between the pin fins). In some embodiments, the cover plate is made of glass.

Figure 4:
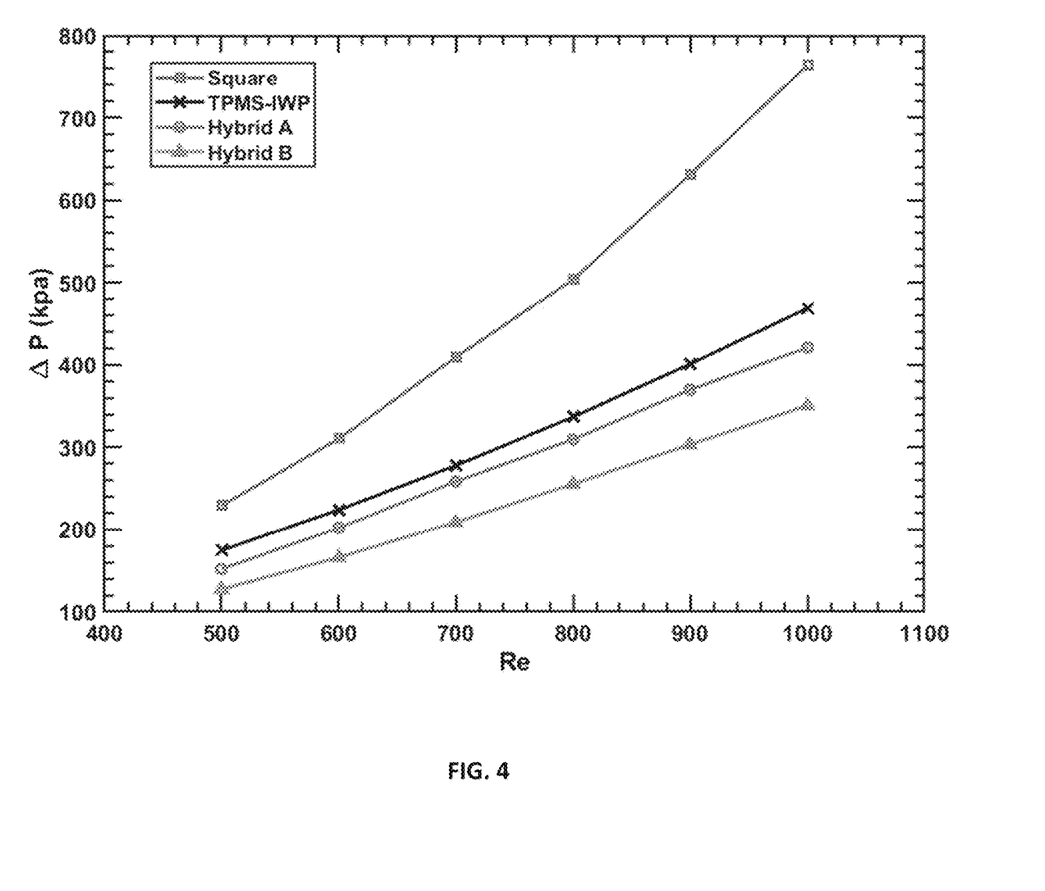

FIG. 4 depicts a comparative analysis of the performance of the microchannel heat sinks with pin-fins according to FIGS. 3A-3D, evaluating the pressure drop of water between the inlet and outlet as it flows through. The results for the four analysed pin fins versus the Reynolds number range of interest are plotted herein. The graph demonstrates that the FIG. 3D Hybrid B pin fin design has the lowest pressure drop, followed by FIG. 3C Hybrid A and FIG. 3B TPMS-IWP pin fins. Compared to the conventional square pin fin FIG. 3A at Re=1000, the TPMS-IWP, Hybrid A, and Hybrid B pins show improvements in pressure drop of 38.65%, 44.91%, and 54%, respectively.

Figure 5:
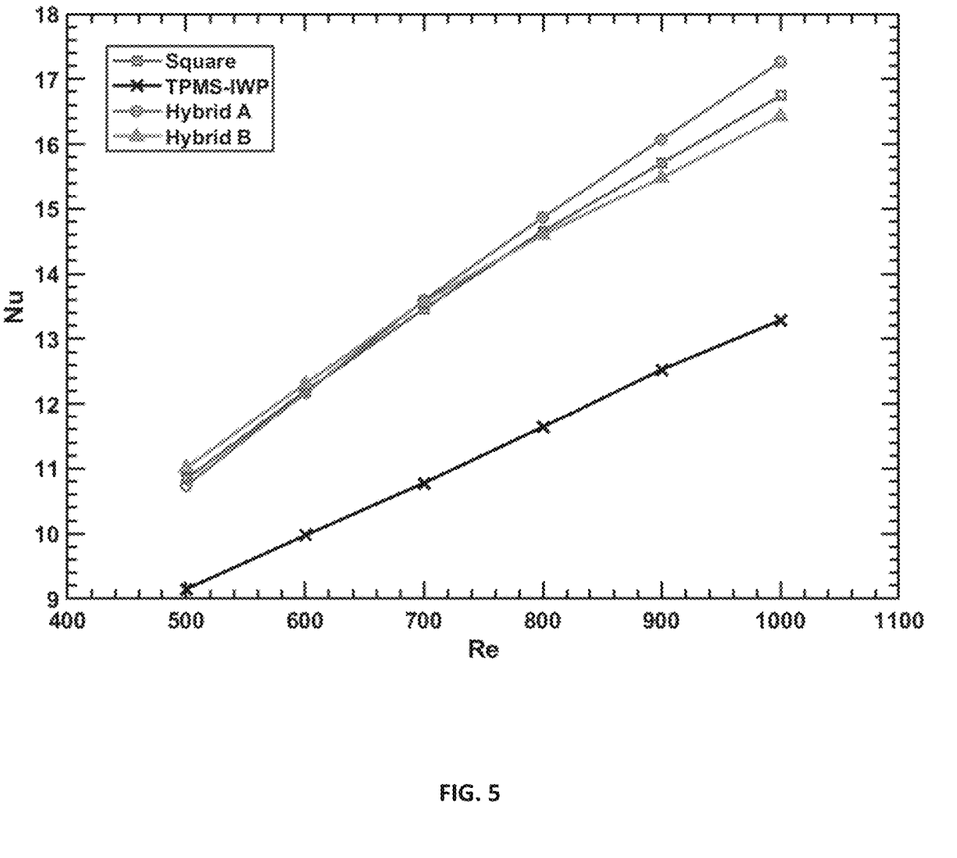
FIG. 5 depicts a comparative analysis of the Nusselt number in the microchannel heat sinks, plotted against the Reynolds number range.

FIG. 5 depicts a comparative analysis of the Nusselt number in the microchannel heat sinks with pin-fins according to FIGS. 3A-3D, plotted against the Reynolds number range. The average Nusselt number in the channel for all designs was determined and plotted against the Reynolds number range. At low Reynolds numbers, all analysed pin fins have similar average Nusselt numbers. The Hybrid A design had a slight advantage at Re=1000 over the conventional square pin, with Hybrid B also showing close performance and no compromise in thermal efficiency. In general, the pin-fins according to the present disclosure show no compromise in this metric as other conventional design (circle, tringle pins . . . etc) usually show.

Figure 6:
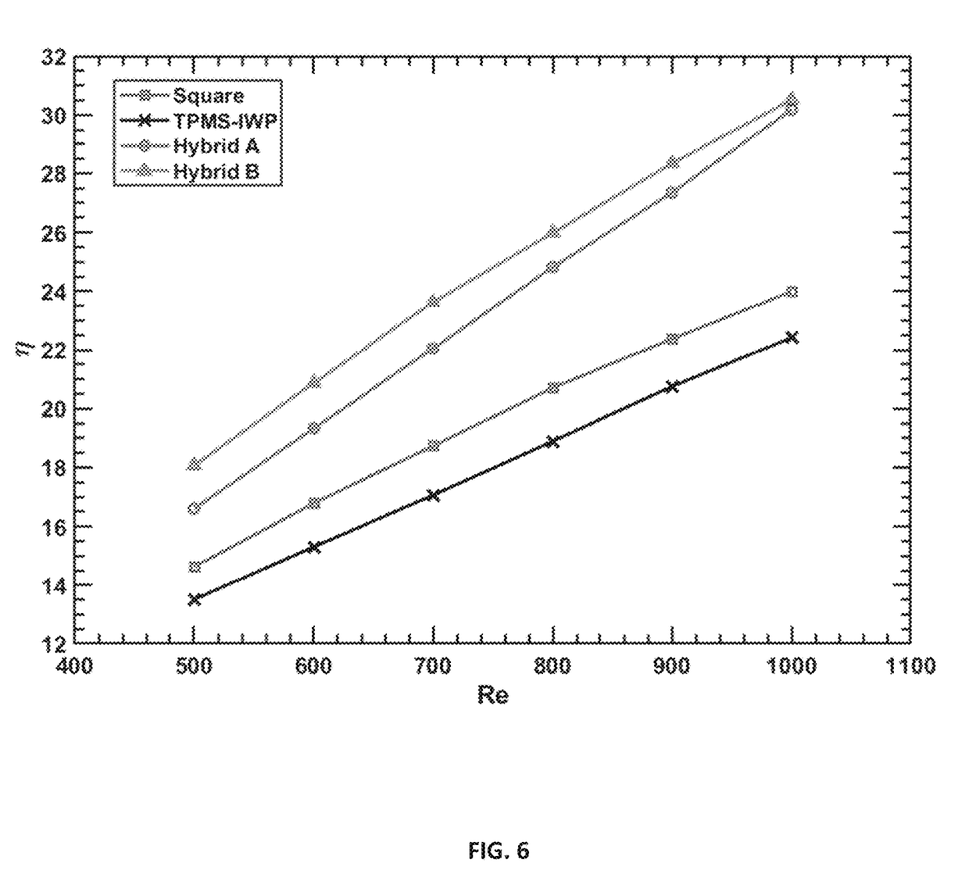
FIG. 6 depicts a comparative analysis of the performance of microchannel heat sinks, evaluating the thermal efficiency index.

FIG. 6 depicts a comparative analysis of the performance of microchannel heat sinks with pin-fins according to FIGS. 3A-3D, evaluating the thermal efficiency index. This metric measures the balance between thermodynamic and hydrodynamic enhancements. The results for this metric were plotted against the Reynolds number for all designs. The Hybrid B design is the most efficient, achieving the lowest pressure drop and a similar average Nusselt number to the Hybrid A and square pin fin designs. Compared to the reference square pin fin, the Hybrid A and B designs had 27.21\% and 25.78\% higher thermal efficiency index values, respectively.

According to a second aspect of the disclosure, provided herein is a microchip comprising a microchannel heat sink according to a first aspect of the disclosure. The microchip may be configured to allow coolant fluid to flow through the microchannel heat sink.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents. The disclosures and the description herein are intended to be illustrative and are not in any sense limiting the invention, defined in scope by the following claims.

Many changes, modifications, variations and other uses and applications of the subject invention will become apparent to those skilled in the art after considering this specification and the accompanying drawings, which disclose the preferred embodiments thereof. All such changes, modifications, variations and other uses and applications, which do not depart from the spirit and scope of the invention, are deemed to be covered by the invention, which is to be limited only by the claims which follow.

What is claimed is:

1. A microchannel heat sink, comprising a base and a plurality of microchannel units extending from the base,
wherein the plurality of microchannel units are arranged in parallel and at regular intervals on the base,
wherein each microchannel unit comprises two or more pin-fins, wherein the two or more pin-fins are arranged as discrete elements spaced at regular intervals within each microchannel unit, with the pin-fins being the same distance apart from one another along the microchannel unit and
wherein each pin-fin comprises a triply periodic minimal surface (TPMS) lattice structure.

2. The microchannel heat sink according to claim 1, wherein each microchannel unit has a length of about 13500 to 16500 micrometres.

3. The microchannel heat sink according to claim 1, wherein each microchannel unit has a width of about 270 to 330 micrometres.

4. The microchannel heat sink according to claim 1, wherein each microchannel unit has a height of about 450 to 550 micrometres.

5. The microchannel heat sink according to claim 1, wherein each microchannel unit has a hydraulic diameter of about 90 to 165 micrometres.

6. The microchannel heat sink according to claim 1, wherein the distance between each pin-fin is about 2250 to 2750 micrometres.

7. The microchannel heat sink according to claim 1, wherein each pin-fin has a length of about 67 to 83 micrometres.

8. The microchannel heat sink according to claim 1, wherein each pin-fin has a height of about 90 to 165 micrometres.

9. The microchannel heat sink according to claim 8, wherein each pin-fin has a height of about 90 to 135 micrometres.

10. The microchannel heat sink according to claim 1, wherein each microchannel unit comprises five pin-fins.

11. The microchannel heat sink according to claim 1, wherein each pin-fin comprises a triply periodic minimal surface (TPMS) lattice structure selected from the group consisting of Gyroid, Diamond, and Iwp.

12. The microchannel heat sink according to claim 11, wherein each pin-fin comprises a TPMS-Iwp lattice structure.

13. The microchannel heat sink according to claim 1, wherein each pin-fin is formed of a hybrid square-TPMS lattice structure.

14. The microchannel heat sink according to claim 13, wherein the hybrid square-TPMS lattice structure is formed of one to two periodic unit cells.

15. The microchannel heat sink according to claim 1, further comprising a cover plate configured to cover the plurality of microchannel units.

16. The microchannel heat sink according to claim 15, wherein the cover plate is glass.

17. A microchip comprising a microchannel heat sink according to claim 1.

18. The microchannel heat sink according to claim 1, wherein the microchannel units are configured to allow a coolant fluid flow from one side to the other, and wherein the base of the microchannel is in direct contact with a microchip in order to reject heat.

* * * * *